(12) United States Patent
Ono et al.

(10) Patent No.: US 12,534,640 B2
(45) Date of Patent: Jan. 27, 2026

(54) POLISHING LIQUID AND POLISHING METHOD

(71) Applicant: Showa Denko Materials Co., Ltd., Tokyo (JP)

(72) Inventors: Hiroshi Ono, Tokyo (JP); Keisuke Inoue, Tokyo (JP); Takahiro Jinushi, Tokyo (JP)

(73) Assignee: Resonac Corporation, Tokyo (JP)

( * ) Notice: Subject to any disclaimer, the term of this patent is extended or adjusted under 35 U.S.C. 154(b) by 265 days.

(21) Appl. No.: 17/928,395

(22) PCT Filed: Jul. 19, 2022

(86) PCT No.: PCT/JP2022/028085
§ 371 (c)(1),
(2) Date: Nov. 29, 2022

(87) PCT Pub. No.: WO2023/008262
PCT Pub. Date: Feb. 2, 2023

(65) Prior Publication Data
US 2024/0228830 A1    Jul. 11, 2024

(30) Foreign Application Priority Data
Jul. 30, 2021    (WO) .................. PCT/JP2021/028425

(51) Int. Cl.
*C09G 1/02*    (2006.01)
*B24B 37/04*    (2012.01)
(Continued)

(52) U.S. Cl.
CPC .............. *C09G 1/02* (2013.01); *B24B 37/044* (2013.01); *C09K 3/1409* (2013.01); *H01L 21/32115* (2013.01)

(58) Field of Classification Search
CPC ...... C09G 1/02; B24B 37/044; C09K 3/1409; C09K 3/1445; C09K 3/1436; H01L 21/32115; H01L 21/3212; H01L 21/31053
(Continued)

(56) References Cited

U.S. PATENT DOCUMENTS

| 4,944,836 A | 7/1990 | Beyer et al. |
| 2012/0094491 A1* | 4/2012 | Kanamaru ........... C09K 3/1472 438/693 |

(Continued)

FOREIGN PATENT DOCUMENTS

| CN | 102449747 A | 5/2012 |
| CN | 106661430 A | 5/2017 |

(Continued)

*Primary Examiner* — Anita K Alanko
(74) *Attorney, Agent, or Firm* — Fitch, Even, Tabin & Flannery LLP

(57) ABSTRACT

A polishing liquid for polishing a surface to be polished containing a tungsten material, the polishing liquid containing abrasive grains, an iron-containing compound, and an oxidizing agent, in which the abrasive grains include silica particles, an average particle diameter of the abrasive grains is 40 to 140 nm, and a silanol group density of the silica particles is 8.0 groups/nm$^2$ or less. A polishing method of polishing a surface to be polished containing a tungsten material by using the polishing liquid.

17 Claims, 1 Drawing Sheet

(51) Int. Cl.
*C09K 3/14* (2006.01)
*H01L 21/321* (2006.01)

(58) Field of Classification Search
USPC .............................................. 252/79.1–79.5
See application file for complete search history.

(56) References Cited

U.S. PATENT DOCUMENTS

2015/0376462 A1* 12/2015 Fu ..................... C09K 3/1463
 438/693
2020/0369917 A1* 11/2020 Otsuka ................... B24B 37/00

FOREIGN PATENT DOCUMENTS

| | | |
|---|---|---|
| CN | 109153889 A | 1/2019 |
| JP | 2009-206148 A | 9/2009 |
| JP | 2019-522896 A | 8/2019 |
| JP | 2021-093457 A | 6/2021 |
| KR | 10-1999-0014245 A | 2/1999 |
| KR | 10-2012-0023712 A | 3/2012 |
| WO | 2011/021599 A1 | 2/2011 |

* cited by examiner (a)
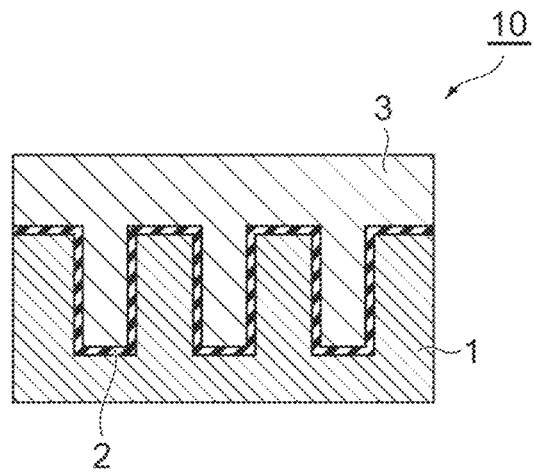
(b)
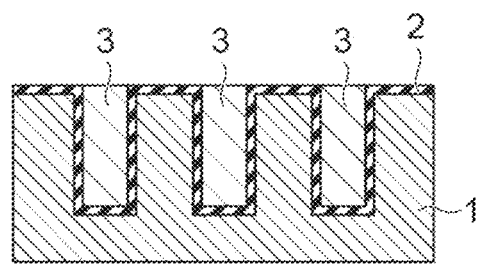
(c)
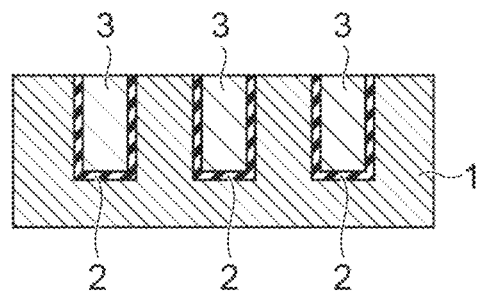

POLISHING LIQUID AND POLISHING METHOD

CROSS-REFERENCE TO RELATED APPLICATIONS

This application is a U.S. national phase application filed under 35 U.S.C. § 371 of International Application No PCT/JP2022/028085, filed Jul. 19, 2022, designating the United States, which claims priority from International Application PCT/JP2021/028425, filed Jul. 30, 2021, which are incorporated herein by reference in their entireties.

TECHNICAL FIELD

The present disclosure relates to a polishing liquid, a polishing method, and the like.

BACKGROUND ART

In recent years, new microfabrication technologies have been developed along with the tendencies of higher integration or higher performance of semiconductor integrated circuits (hereinafter, referred to as "LSI"). A chemical mechanical polishing (hereinafter, referred to as "CMP") method is one of such technologies, which is frequently used in the LSI manufacturing process (in particular, flattening of interlayer insulating films, formation of metal plugs, formation of embedded wirings, and the like in multilayer wiring forming processes) (see, for example, Patent Literature 1 below).

A damascene method is known as the formation of embedded wirings using CMP. In the damascene method, for example, first, depressions and projections are formed on a surface of an insulating member (a member containing an insulating material such as silicon oxide), a barrier member having a shape following the surface of the insulating member is then formed, and a metallic material (for example, wiring metal) is deposited on the entire barrier member so as to embed the depressed portions (trench portions) to obtain a metallic member, thereby obtaining a base substrate (body to be polished). Next, an unnecessary metallic member other than the depressed portions is removed, and then the barrier member positioned on the projecting portions of the insulating member is removed by CMP, thereby forming embedded wirings.

In recent years, a tungsten material such as tungsten or a tungsten alloy has been used as a metallic material. An example of a method for forming a wiring of a tungsten material using a damascene method is illustrated in FIG. 1. As illustrated in FIG. 1(a), a base substrate (body to be polished) 10 has an insulating member 1 having depressions and projections on the surface thereof, a barrier member (a member containing a barrier material) 2 having a shape following the surface of the insulating member 1, and a tungsten member (a member containing a tungsten material) 3 covering the entire barrier member 2 to embed the depressed portions. A method of polishing the base substrate 10 includes, in the stated order, a first polishing step of polishing the tungsten member 3 until the barrier member 2 is exposed (rough polishing step; FIG. 1(a) and FIG. 1(b)), a second polishing step of polishing the barrier member 2 and the tungsten member 3 until the insulating member 1 is exposed (FIG. 1(b) and FIG. 1(c)), and a third polishing step of polishing the insulating member 1, the barrier member 2, and the tungsten member 3 for eliminating the step height generated in the first and second polishing steps and adjusting a thickness to an appropriate thickness (finish polishing step).

As a polishing liquid used for polishing the tungsten material, for example, Patent Literature 2 below discloses a polishing liquid containing colloidal silica, an inorganic acid, iron nitrate, and the like.

CITATION LIST

Patent Literature

Patent Literature 1: U.S. Pat. No. 4,944,836
Patent Literature 2: Japanese Unexamined Patent Publication No. 2009-206148

SUMMARY OF INVENTION

Technical Problem

However, the polishing liquid used for polishing the tungsten material is required to polish the tungsten material at a further superior polishing rate, from the viewpoint of enhancing the process efficiency of wiring formation by the damascene method, and the like.

An object of an aspect of the present disclosure is to provide a polishing liquid capable of polishing a tungsten material at a superior polishing rate. An object of another aspect of the present disclosure is to provide a polishing method using such a polishing liquid.

Solution to Problem

The present inventors have found that, by using a polishing liquid containing specific abrasive grains, an iron-containing compound, and an oxidizing agent, a tungsten material can be polished at a superior polishing rate.

An aspect of the present disclosure provides a polishing liquid for polishing a surface to be polished containing a tungsten material, the polishing liquid containing abrasive grains, an iron-containing compound, and an oxidizing agent, in which the abrasive grains include silica particles, an average particle diameter of the abrasive grains is 40 to 140 nm, and a silanol group density of the silica particles is 8.0 groups/nm$^2$ or less.

Another aspect of the present disclosure provides a polishing method of polishing a surface to be polished containing a tungsten material by using the aforementioned polishing liquid.

The present disclosure relates to the following <1> to <15> and the like in several aspects.

<1> A polishing liquid for polishing a surface to be polished containing a tungsten material, the polishing liquid containing abrasive grains, an iron-containing compound, and an oxidizing agent, in which the abrasive grains include silica particles, an average particle diameter of the abrasive grains is 40 to 140 nm, and a silanol group density of the silica particles is 8.0 groups/nm$^2$ or less.

<2> The polishing liquid described in <1>, in which the average particle diameter of the abrasive grains is 40 to 85 nm.

<3> The polishing liquid described in <1> or <2>, in which the silanol group density of the silica particles is 2.5 groups/nm$^2$ or less.

<4> The polishing liquid described in any one of <1> to <3>, in which the silanol group density of the silica particles is less than 2.0 groups/nm$^2$, and a content of aluminum atoms is less than 0.000006% by mass on the basis of the total mass of the polishing liquid.

<5> The polishing liquid described in any one of <1> to <4>, in which a zeta potential of the silica particles in the polishing liquid is more than −10 mV, and a content of aluminum atoms is less than 0.000006% by mass on the basis of the total mass of the polishing liquid.

<6> The polishing liquid described in any one of <1> to <5>, in which the iron-containing compound includes at least one selected from the group consisting of iron nitrate and a hydrate thereof.

<7> The polishing liquid described in any one of <1> to <6>, in which a content of the iron-containing compound is 0.0001 to 0.1% by mass on the basis of the total mass of the polishing liquid.

<8> The polishing liquid described in any one of <1> to <7>, in which the oxidizing agent includes hydrogen peroxide.

<9> The polishing liquid described in any one of <1> to <8>, further containing an organic acid component.

<10> The polishing liquid described in <9>, in which the organic acid component includes at least one selected from the group consisting of a divalent organic acid component and a trivalent organic acid component as an organic acid component not having a carbon-carbon unsaturated bond.

<11> The polishing liquid described in <9> or <10>, in which the organic acid component includes at least one selected from the group consisting of malonic acid, succinic acid, adipic acid, glutaric acid, malic acid, citric acid, and salts thereof.

<12> The polishing liquid described in any one of <1> to <11>, in which a pH is 2.0 to 4.0.

<13> The polishing liquid described in any one of <1> to <12>, in which a pH is 2.5 to 3.5.

<14> A polishing method of polishing a surface to be polished containing a tungsten material by using the polishing liquid described in any one of <1> to <13>.

According to such a polishing liquid and a polishing method, a tungsten material can be polished at a superior polishing rate.

Advantageous Effects of Invention

According to an aspect of the present disclosure, it is possible to provide a polishing liquid capable of polishing a tungsten material at a superior polishing rate. According to another aspect of the present disclosure, it is possible to provide a polishing method using such a polishing liquid.

BRIEF DESCRIPTION OF DRAWINGS

FIG. 1 is a schematic cross-sectional view for describing a method for forming a wiring of a tungsten material.

DESCRIPTION OF EMBODIMENTS

Hereinafter, embodiments of the present disclosure will be described. However, the present disclosure is not limited to the following embodiments and can be modified variously within the scope of the spirit thereof and carried out.

Definition

In the present specification, the term "polishing rate" means a rate at which a material to be polished is removed by polishing (for example, a reduced amount of a thickness of the material to be polished per time; Removal Rate). The term "abrasive grains" means an aggregation of a plurality of particles, and for convenience, one particle constituting the abrasive grains may be referred to as an abrasive grain. The term "step" includes not only an independent step but also a step by which an intended action of the step is achieved, though the step cannot be clearly distinguished from other steps. The term "film" includes a structure having a shape which is formed on a part, in addition to a structure having a shape which is formed on the whole surface, when the film has been observed as a plan view. A numerical range that has been indicated by use of "to" indicates the range that includes the numerical values which are described before and after "to," as the minimum value and the maximum value, respectively. "A or more" in the numerical range means A and a range of more than A. "A or less" in the numerical range means A and a range of less than A. In the numerical ranges that are described stepwise in the present specification, the upper limit value or the lower limit value of the numerical range of a certain stage can be arbitrarily combined with the upper limit value or the lower limit value of the numerical range of another stage. In the numerical ranges that are described in the present specification, the upper limit value or the lower limit value of the numerical range may be replaced with the value shown in Examples. "A or B" may include either one of A and B, and may also include both of A and B. Materials listed as examples in the present specification can be used singly or in combinations of two or more, unless otherwise specifically indicated. When a plurality of substances corresponding to each component exist in the composition, the content of each component in the composition means the total amount of the plurality of substances that exist in the composition, unless otherwise specified.

Polishing Liquid

A polishing liquid of the present embodiment is a polishing liquid for polishing a surface to be polished containing a tungsten material (a polishing liquid for a tungsten material). The "tungsten material" means a material containing 50 mol % or more of tungsten, and examples thereof include tungsten (simple substance), a tungsten alloy, and a tungsten compound (such as tungsten oxide, tungsten silicide, or tungsten nitride). The polishing liquid of the present embodiment can be used as a CMP polishing liquid.

The polishing liquid of the present embodiment contains abrasive grains, an iron-containing compound, and an oxidizing agent. In the polishing liquid of the present embodiment, the abrasive grains include silica particles, an average particle diameter of the abrasive grains is 40 to 140 nm, and a silanol group density of the silica particles is 8.0 groups/nm$^2$ or less.

According to the polishing liquid of the present embodiment, the tungsten material can be polished at a superior polishing rate. The present inventors speculate the reasons why such an effect is obtainable as follows. However, the reasons are not limited to the contents to be as follows. That is, in the polishing liquid containing silica particles as the abrasive grains, when the silanol group (Si—OH) density of the silica particles is equal to or less than the aforementioned content, the silanol group density inside the silica particles is considered to be also small. In this case, since the siloxane bond (Si—O—Si) density is large with respect to the silanol group density inside the silica particles, and the hardness (rigidity) of the silica particles is superior because of sufficient formation of a network structure by the siloxane bond, the mechanical action (physical action) of the abrasive grains is improved. Furthermore, when the average particle diameter of the abrasive grains is within the above range, both of the physical polishing ability per one particle and the number of particles per unit area of the surface to be polished are preferably achieved, and thus the mechanical action of the abrasive grains is improved. Further, when the polishing liquid contains the iron-containing compound and the oxidizing agent in addition to the abrasive grains, the mechanical action of the abrasive grains, the chemical action of the polishing liquid, and the like are preferably obtained, and thus it is considered that the tungsten material can be polished at a superior polishing rate.

According to the polishing liquid of the present embodiment, in an evaluation method of Examples described below, the polishing rate for the tungsten material of, for example, 350 nm/min or more can be obtained. The polishing rate for the tungsten material may be 370 nm/min or more, 380 nm/min or more, 390 nm/min or more, 400 nm/min or more, or 410 nm/min or more.

The polishing liquid of the present embodiment may be used for polishing an insulating material (for example, silicon oxide). According to the polishing liquid of the present embodiment, for example, in an evaluation method of Examples described below, the polishing rate for the silicon oxide of 80 nm/min or more can be obtained. The polishing rate for the silicon oxide may be 90 nm/min or more, 110 nm/min or more, 130 nm/min or more, 150 nm/min or more, 170 nm/min or more, 190 nm/min or more, 210 nm/min or more, or 230 nm/min or more. In the first polishing step in the polishing method (wiring formation by the damascene method) including the first polishing step (rough polishing step), the second polishing step, and the third polishing step (finish polishing step) described above, it is sufficient to achieve a superior polishing rate for the tungsten material; on the other hand, in the third polishing step, a superior polishing rate is required for both of the tungsten material and the insulating material. On the other hand, according to the polishing liquid of the present embodiment, since a superior polishing rate can be obtained for both of the tungsten material and the insulating material, the first, second, and third polishing steps can be performed using a single polishing liquid, and thus it is possible to suppress complex processes and an increase in cost caused by using a plurality of polishing liquids in the wiring formation by the damascene method.

The polishing liquid of the present embodiment may selectively polish the tungsten material (for example, tungsten) with respect to the insulating material (for example, silicon oxide). According to the polishing liquid of the present embodiment, for example, in an evaluation method of Examples described below, the polishing rate ratio of the tungsten material with respect to the insulating material (the polishing rate for the tungsten material/the polishing rate for the insulating material) of, for example, 0.1 or more can be obtained. The polishing rate ratio of the tungsten material with respect to the insulating material may be 0.5 or more, 1.0 or more, 1.5 or more, 2.0 or more, 2.3 or more, 2.7 or more, 3.0 or more, 3.4 or more, 3.8 or more, 3.9 or more, 4.0 or more, 4.1 or more, 4.2 or more, 4.3 or more, or 4.4 or more. The polishing rate ratio of the tungsten material with respect to the insulating material may be 5.5 or less, 5.0 or less, 4.5 or less, 4.0 or less, or 3.5 or less.

According to the polishing liquid of the present embodiment, since abrasive grains whose polishing rate is more easily improved than that of conventional abrasive grains, in comparison in a case where the contents of both the abrasive grains are equivalent, are used, the content of the abrasive grains can be decreased while a sufficient polishing rate is obtained, and an increase in cost associated with an increase in content of the abrasive grains for increasing the polishing rate can be avoided.

According to the present embodiment, it is possible to provide application of the polishing liquid to polishing of a surface to be polished containing a tungsten material. The polishing liquid of the present embodiment may be used for polishing a surface to be polished containing a tungsten material and an insulating material. According to the present embodiment, it is possible to provide application of the polishing liquid to polishing of a surface to be polished containing a tungsten material and an insulating material. According to the present embodiment, it is possible to provide application of the polishing liquid to polishing in a wiring formation step of a semiconductor device.

Abrasive Grains

The polishing liquid of the present embodiment contains abrasive grains including silica particles (particles containing silica).

Examples of the silica particles include amorphous silica, crystalline silica, molten silica, spherical silica, synthetic silica, hollow silica, and colloidal silica. From the viewpoint of easily polishing the tungsten material and the insulating material at a superior polishing rate, the viewpoint of easily suppressing occurrence of defects such as scratches on the polished surface after polishing, and the viewpoint of easily improving the flatness of the polished surface, the abrasive grains may include colloidal silica.

The average particle diameter of the abrasive grains is 40 to 140 nm as described above. From the viewpoint that the physical polishing ability per one particle is improved so that the tungsten material and the insulating material are easily polished at a superior polishing rate, the average particle diameter of the abrasive grains may be 45 nm or more, 50 nm or more, 55 nm or more, or 60 nm or more. The average particle diameter of the abrasive grains may be 65 nm or more, 70 nm or more, more than 70 nm, 75 nm or more, 80 nm or more, more than 80 nm, 85 nm or more, 90 nm or more, 95 nm or more, 100 nm or more, more than 100 nm, 105 nm or more, or 110 nm or more, from the viewpoint of adjusting the balance in polishing rate between the tungsten material and the insulating material. From the viewpoint that the number of particles per unit area of the surface to be polished is increased so that the tungsten material and the insulating material are easily polished at a superior polishing rate, the average particle diameter of the abrasive grains may be 135 nm or less, 130 nm or less, 125 nm or less, 120 nm or less, 115 nm or less, or 110 nm or less. The average particle diameter of the abrasive grains may be 105 nm or less, 100 nm or less, 95 nm or less, 90 nm or less, less than 90 nm, 85 nm or less, 80 nm or less, 75 nm or less, 70 nm or less, or 65 nm or less, from the viewpoint of adjusting the balance in polishing rate between the tungsten material and the insulating material. From these viewpoints, the average particle diameter of the abrasive grains may be 40 to 135 nm, 40 to 130 nm, 40 to 120 nm, 40 to 110 nm, 40 to 100 nm, 40 to 90 nm, 40 nm or more and less than 90 nm, 45 to 115 nm, 50 to 120 nm, 50 to 110 nm, 55 to 110 nm, 60 to 110 nm, 60 to 100 nm, 60 nm or more and less than 90 nm, or 40 to 85 nm.

From the viewpoint that the physical polishing ability per one particle is improved so that the tungsten material and the insulating material are easily polished at a superior polishing rate, the average particle diameter of the silica particles may be 40 nm or more, 45 nm or more, 50 nm or more, 55 nm or more, or 60 nm or more. The average particle diameter of the silica particles may be 65 nm or more, 70 nm or more, more than 70 nm, 75 nm or more, 80 nm or more, more than 80 nm, 85 nm or more, 90 nm or more, 95 nm or more, 100 nm or more, more than 100 nm, 105 nm or more, or 110 nm or more, from the viewpoint of adjusting the balance in polishing rate between the tungsten material and the insulating material. From the viewpoint that the number of particles per unit area of the surface to be polished is increased so that the tungsten material and the insulating material are easily polished at a superior polishing rate, the average particle diameter of the silica particles may be 140 nm or less, 135 nm or less, 130 nm or less, 125 nm or less, 120 nm or less, 115 nm or less, or 110 nm or less. The average particle diameter of the silica particles may be 105 nm or less, 100 nm or less, 95 nm or less, 90 nm or less, less than 90 nm, 85 nm or less, 80 nm or less, 75 nm or less, 70 nm or less, or 65 nm or less, from the viewpoint of adjusting the balance in polishing rate between the tungsten material and the insulating material. From these viewpoints, the average particle diameter of the silica particles may be 40 to 140 nm, 40 to 135 nm, 40 to 130 nm, 40 to 120 nm, 40 to 110 nm, 40 to 100 nm, 40 to 90 nm, 40 nm or more and less than 90 nm, 45 to 115 nm, 50 to 120 nm, 50 to 110 nm, 55 to 110 nm, 60 to 110 nm, 60 to 100 nm, 60 nm or more and less than 90 nm, or 40 to 85 nm.

The "average particle diameter" of the abrasive grains (for example, silica particles) means a secondary particle diameter as measured by the following method. The average particle diameter can be measured, for example, by dispersing the abrasive grains in water to prepare a sample and measuring the sample using an optical diffraction scattering particle size distribution meter. For example, the average particle diameter can be measured using COULTER N4SD manufactured by COULTER Electronics under the conditions of a measurement temperature of 20° C., a solvent refractive index of 1.333 (water), a particle refractive index of unknown (set), a solvent viscosity of 1.005 cp (water), a run time of 200 seconds, a laser incidence angle of 90°, and an intensity (corresponding to scattering intensity and turbidity) in a range of 5E+04 to 4E+05, and in a case where the intensity is higher than 4E+05, the abrasive grains are diluted with water and then the average particle diameter thereof can be measured. Since colloidal particles (for example, colloidal silica) are usually obtained in a state of being dispersed in water, the average particle diameter of the colloidal particles can be measured by appropriately diluting the colloidal particles so that the intensity is in a range of the above scattering intensity. The sample in which the abrasive grains are dispersed in water may be produced by dispersing the abrasive grains before being mixed with another component for preparing the polishing liquid in water, and may be produced by dispersing the abrasive grains recovered from the polishing liquid in water. As a guideline, the content when the average particle diameter is measured may be 0.5 to 2.0% by mass. The average particle diameter of the abrasive grains may be an average particle diameter of the abrasive grains before preparation of the polishing liquid or an average particle diameter of the abrasive grains recovered from the polishing liquid, on the basis of the fact that a change in average particle diameter before and after preparation of the polishing liquid is small.

The silanol group density of the silica particles (the number of silanol groups per 1 nm$^2$ of the surface area of the silica particles) is 8.0 groups/nm$^2$ or less from the viewpoint of polishing the tungsten material at a superior polishing rate. The silanol group density of the silica particles may be 7.0 groups/nm$^2$ or less, 6.5 groups/nm$^2$ or less, or 6.0 groups/nm$^2$ or less, from the viewpoint of easily polishing the tungsten material and the insulating material at a superior polishing rate. The silanol group density of the silica particles may be 5.5 groups/nm$^2$ or less, 5.0 groups/nm$^2$ or less, less than 5.0 groups/nm$^2$, 4.8 groups/nm$^2$ or less, 4.5 groups/nm$^2$ or less, 4.0 groups/nm$^2$ or less, less than 4.0 groups/nm$^2$, 3.5 groups/nm$^2$ or less, 3.2 groups/nm$^2$ or less, 3.0 groups/nm$^2$ or less, less than 3.0 groups/nm$^2$, 2.5 groups/nm$^2$ or less, 2.2 groups/nm$^2$ or less, 2.0 groups/nm$^2$ or less, less than 2.0 groups/nm$^2$, 1.9 groups/nm$^2$ or less, 1.8 groups/nm$^2$ or less, 1.7 groups/nm$^2$ or less, or 1.6 groups/nm$^2$ or less, from the viewpoint of adjusting the balance in polishing rate between the tungsten material and the insulating material. The silanol group density of the silica particles is more than 0 groups/nm$^2$, and may be 0.1 groups/nm$^2$ or more, 0.5 groups/nm$^2$ or more, 1.0 group/nm$^2$ or more, 1.2 groups/nm$^2$ or more, 1.3 groups/nm$^2$ or more, 1.4 groups/nm$^2$ or more, 1.5 groups/nm$^2$ or more, or 1.6 groups/nm$^2$ or more, from the viewpoint of easily polishing the tungsten material and the insulating material at a superior polishing rate. The silanol group density of the silica particles may be 1.7 groups/nm$^2$ or more, 1.8 groups/nm$^2$ or more, 2.0 groups/nm$^2$ or more, 2.2 groups/nm$^2$ or more, 2.5 groups/nm$^2$ or more, 3.0 groups/nm$^2$ or more, 3.2 groups/nm$^2$ or more, 3.5 groups/nm$^2$ or more, 4.0 groups/nm$^2$ or more, 4.5 groups/nm$^2$ or more, 4.8 groups/nm$^2$ or more, 5.0 groups/nm$^2$ or more, 5.5 groups/nm$^2$ or more, or 6.0 groups/nm$^2$ or more, from the viewpoint of adjusting the balance in polishing rate between the tungsten material and the insulating material. From these viewpoints, the silanol group density of the silica particles may be more than 0 groups/nm$^2$ and 8.0 groups/nm$^2$ or less, more than 0 groups/nm$^2$ and 3.0 groups/nm$^2$ or less, more than 0 groups/nm$^2$ and less than 2.0 groups/nm$^2$, 0.1 to 7.0 groups/nm$^2$, 0.5 to 6.0 groups/nm$^2$, 1.0 to 5.0 groups/nm$^2$, 1.2 to 4.0 groups/nm$^2$, 1.5 to 3.0 groups/nm$^2$, 1.5 to 2.0 groups/nm$^2$, 1.5 groups/nm$^2$ or more and less than 2.0 groups/nm$^2$, or 1.6 to 1.8 groups/nm$^2$.

The silanol group density ($\rho$ [groups/nm$^2$]) of the silica particles can be measured and calculated as follows.

[1] A particle dispersion liquid (such as colloidal silica) containing 15 g of silica particles is weighed in a plastic bottle A.

[2] The pH of a mixture A of silica particles and hydrochloric acid is adjusted to 3.0 to 3.5 by adding a 0.1 mol/L hydrochloric acid aqueous solution to the particle dispersion liquid of [1]. At this time, the addition amount [g] of the 0.1 mol/L hydrochloric acid aqueous solution is previously measured.

[3] The mass of the mixture A is calculated.

[4] The mixture A is weighed in a plastic bottle B at a mass corresponding to 1/10 of the mass obtained in [3] (the mass of the mixture A).

[5] After 30 g of sodium chloride is added to the mixture A in the plastic bottle B, ultrapure water is added thereto to obtain a mixture B having a total amount of 150 g.

[6] A 0.1 mol/L sodium hydroxide aqueous solution is added to the mixture B to adjust a pH, thereby obtaining a mixture C having a pH of 4.0.

[7] A 0.1 mol/L sodium hydroxide aqueous solution is added to the mixture C until the pH reaches 9.0, and the amount of sodium hydroxide (B [mol]) required for changing the pH from 4.0 to 9.0 is calculated.

[8] The silanol group density of the silica particles is calculated by Formula (1) below.

$$\rho = B \cdot NA/(A \cdot S_{BET}) \qquad (1)$$

[In Formula (1), NA [number/mol] represents an Avogadro number, A [g] represents the amount of the silica particles, and $S_{BET}$ [m$^2$/g] represents a BET specific surface area of the silica particles.]

The BET specific surface area $S_{BET}$ of the silica particles can be measured according to a BET specific surface area method. For example, the BET specific surface area of the silica particles can be determined as follows. A sample, which is obtained by drying the silica particles (such as colloidal silica) in a drier at 150° C., transferring the silica particles to a measurement cell, and deaerating in vacuum at 120° C. for 60 minutes, is subjected to a one-point method or a multi-point method of causing the sample to absorb a nitrogen gas by using a BET specific surface area measurement apparatus. Specifically, a measurement sample obtained by finely pulverizing the silica particles dried at 150° C. using a mortar (made of porcelain, 100 mL) is placed in a measurement cell, and the BET specific surface area $S_{BET}$ of the silica particles can be measured using a BET specific surface area measurement apparatus (for example, manufactured by Yuasa Ionics, Inc., trade name: NOVE-1200).

The silanol group density of the silica particles can be obtained by using silica particles before being mixed with other components for adjusting the polishing liquid or silica particles recovered from the polishing liquid. The silanol group density of the silica particles may be a silanol group density of silica particles before preparation of the polishing liquid or a silanol group density of silica particles recovered from the polishing liquid, on the basis of the fact that a change in silanol group density before and after preparation of the polishing liquid is small.

Details of the calculation method of the silanol group density of the silica particles is disclosed in, for example, Analytical Chemistry, 1956, Vol. 28, No. 12, p. 1981-1983 and Japanese Journal of Applied Physics, 2003, Vol. 42, p. 4992-4997.

The abrasive grains in the polishing liquid of the present embodiment may include particles other than the silica particles. Examples of the constituent material for the particles other than the silica particles include hydroxides of alumina, ceria, zirconia, and cerium, and resin particles.

The zeta potential (25° C.) of the abrasive grains (for example, silica particles) in the polishing liquid may be positive or negative. The zeta potential of the abrasive grains in the polishing liquid can be measured, for example, using DT1202 (trade name) manufactured by Nihon Rufuto Co., Ltd.

The zeta potential of the abrasive grains in the polishing liquid may be −50 mV or more, −35 mV or more, −25 mV or more, −20 mV or more, more than −20 mV, −15 mV or more, −10 mV or more, more than −10 mV, −5.0 mV or more, −3.0 mV or more, −2.0 mV or more, −1.5 mV or more, −1.0 mV or more, −0.5 mV or more, −0.1 mV or more, 0 mV or more, more than 0 mV, 0.1 mV or more, 0.5 mV or more, 1.0 mV or more, 2.0 mV or more, 3.0 mV or more, 4.0 mV or more, 5.0 mV or more, 6.0 mV or more, 7.0 mV or more, 8.0 mV or more, 9.0 mV or more, 10 mV or more, 11 mV or more, 12 mV or more, or 13 mV or more. The zeta potential of the abrasive grains in the polishing liquid may be 50 mV or less, 30 mV or less, 20 mV or less, 15 mV or less, 13 mV or less, 12 mV or less, 11 mV or less, 10 mV or less, 9.0 mV or less, 8.0 mV or less, 7.0 mV or less, 6.0 mV or less, 5.0 mV or less, less than 5.0 mV, 4.0 mV or less, 3.0 mV or less, 2.0 mV or less, 1.0 mV or less, 0.5 mV or less, 0.1 mV or less, 0 mV or less, less than 0 mV, −0.1 mV or less, −0.5 mV or less, or −1.0 mV or less. From these viewpoints, the zeta potential of the abrasive grains in the polishing liquid may be −50 to 50 mV, −35 to 30 mV, −20 to 20 mV, more than −10 mV and 50 mV or less, more than −10 mV and 30 mV or less, more than −10 mV and 20 mV or less, more than −10 mV and 15 mV or less, −5.0 to 15 mV, or −1.0 to 13 mV or less.

The content of the silica particles in the abrasive grains may be 50% by mass or more, 60% by mass or more, 70% by mass or more, 80% by mass or more, 90% by mass or more, 95% by mass or more, 98% by mass or more, or 99% by mass or more, on the basis of the total mass of the abrasive grains (the whole abrasive grains contained in the polishing liquid), from the viewpoint of easily polishing the tungsten material and the insulating material at a superior polishing rate. The abrasive grains may be an embodiment composed of silica particles (substantially 100% by mass of the abrasive grains contained in the polishing liquid is silica particles).

The content of the abrasive grains may be in the following range on the basis of the total mass of the polishing liquid. The content of the abrasive grains may be 0.01% by mass or more, 0.02% by mass or more, 0.05% by mass or more, 0.08% by mass or more, 0.1% by mass or more, 0.2% by mass or more, 0.3% by mass or more, 0.5% by mass or more, 1.0% by mass or more, more than 1.0% by mass, 1.2% by mass or more, 1.4% by mass or more, 1.5% by mass or more, 1.6% by mass or more, 1.8% by mass or more, or 2.0% by mass or more, from the viewpoint of easily polishing the tungsten material and the insulating material at a superior polishing rate. The content of the abrasive grains may be 20% by mass or less, 15% by mass or less, 10% by mass or less, 5.0% by mass or less, less than 5.0% by mass, 3.0% by mass or less, less than 3.0% by mass, 2.5% by mass or less, 2.2% by mass or less, 2.0% by mass or less, less than 2.0% by mass, 1.8% by mass or less, 1.6% by mass or less, 1.5% by mass or less, 1.4% by mass or less, or 1.2% by mass or less, from the viewpoint of easily suppressing occurrence of defects such as scratches on the polished surface after polishing and the viewpoint of cost. From these viewpoints, the content of the abrasive grains may be 0.01 to 20% by mass, 0.02 to 15% by mass, 0.05 to 10% by mass, 0.1 to 5.0% by mass, 0.2 to 3.0% by mass, or 0.3 to 2.0% by mass.

Iron-Containing Compound

The polishing liquid of the present embodiment contains an iron-containing compound (a compound containing an iron component; provided that, a compound corresponding to the abrasive grains is excluding). The iron-containing compound may include an iron ion-containing compound containing iron ions, and may include an iron ion supplying agent that supplies iron ions into the polishing liquid. The iron ion may be a ferric ion ($Fe^{2+}$). When the polishing liquid contains the iron-containing compound, that is, the polishing liquid contains an iron component (for example, iron ions), the tungsten material can be polished at a superior polishing rate.

The iron-containing compound may include a salt of iron as an iron ion supplying agent. The iron ion supplying agent may be dissociated into an iron ion and a counter anion component derived from the iron ion supplying agent in the polishing liquid. The iron-containing compound (for example, the iron ion supplying agent) functions as an oxidizing agent in some cases, but a compound corresponding to both of an iron-containing compound and an oxidizing agent corresponds to an iron-containing compound in the present specification.

The iron-containing compound may include an inorganic salt of iron or an organic salt of iron as an iron ion supplying agent. Examples of the inorganic salt of iron include iron nitrate, iron sulfate, iron boride, iron chloride, iron bromide, iron iodide, iron phosphate, and iron fluoride. Examples of the organic salt of iron include iron triformate, iron diformate, iron acetate, iron propionate, iron oxalate, iron malonate, iron succinate, iron malate, iron glutarate, iron tartrate, iron lactate, and iron citrate. The iron-containing compound may include a ligand such as ammonia or water, and may be a hydrate or the like. From the viewpoint of easily polishing the tungsten material at a superior polishing rate, the viewpoint of easily suppressing contamination to a polishing apparatus and a base substrate, and the viewpoint of being inexpensive and easily available, the iron-containing compound may include an inorganic salt of iron, may include at least one selected from the group consisting of iron nitrate and a hydrate thereof, and may include an iron nitrate nonahydrate.

The content of the iron-containing compound may be in the following range on the basis of the total mass of the polishing liquid. The content of the iron-containing compound may be 0.0001% by mass or more, 0.0003% by mass or more, 0.0005% by mass or more, 0.0008% by mass or more, 0.001% by mass or more, 0.003% by mass or more, 0.005% by mass or more, 0.007% by mass or more, or 0.008% by mass or more, from the viewpoint of easily polishing the tungsten material at a superior polishing rate. The content of the iron-containing compound may be 1% by mass or less, 0.5% by mass or less, 0.1% by mass or less, 0.08% by mass or less, 0.05% by mass or less, 0.03% by mass or less, 0.01% by mass or less, 0.009% by mass or less, or 0.008% by mass or less, from the viewpoint of easily polishing the tungsten material at a superior polishing rate since decomposition and transformation of the oxidizing agent are easily suppressed. From these viewpoints, the content of the iron-containing compound may be 0.0001 to 1% by mass, 0.0001 to 0.1% by mass, 0.0003 to 0.1% by mass, 0.0005 to 0.05% by mass, or 0.001 to 0.01% by mass.

The content of the iron ion may be in the following range on the basis of the total mass of the polishing liquid. The content of the iron ion may be 0.0001% by mass or more, 0.0003% by mass or more, 0.0005% by mass or more, 0.0008% by mass or more, 0.001% by mass or more, or 0.0011% by mass or more, from the viewpoint of easily polishing the tungsten material at a superior polishing rate. The content of the iron ion may be 0.1% by mass or less, 0.05% by mass or less, 0.01% by mass or less, 0.008% by mass or less, 0.005% by mass or less, 0.003% by mass or less, 0.0025% by mass or less, 0.002% by mass or less, 0.0015% by mass or less, or 0.0012% by mass or less, from the viewpoint of easily polishing the tungsten material at a superior polishing rate. From these viewpoints, the content of the iron ion may be 0.0001 to 0.1% by mass, 0.0003 to 0.05% by mass, 0.0005 to 0.01% by mass, or 0.001 to 0.005% by mass.

A mass ratio R1 of the content of the iron-containing compound with respect to the content of the abrasive grains (the content of the iron-containing compound/the content of the abrasive grains) may be in the following range. The mass ratio R1 may be 0.0001 or more, 0.0005 or more, 0.001 or more, 0.002 or more, 0.003 or more, or 0.004 or more, from the viewpoint of easily polishing the tungsten material and the insulating material at a superior polishing rate. The mass ratio R1 may be 0.005 or more or 0.006 or more, from the viewpoint of adjusting the balance in polishing rate between the tungsten material and the insulating material. The mass ratio R1 may be 0.1 or less, 0.05 or less, 0.01 or less, 0.008 or less, or 0.007 or less, from the viewpoint of easily polishing the tungsten material and the insulating material at a superior polishing rate. The mass ratio R1 may be 0.006 or less, 0.005 or less, or 0.004 or less, from the viewpoint of adjusting the balance in polishing rate between the tungsten material and the insulating material. From these viewpoints, the mass ratio R1 may be 0.0001 to 0.1, 0.0005 to 0.05, or 0.001 to 0.01.

Oxidizing Agent

The polishing liquid of the present embodiment contains an oxidizing agent (provided that, a compound corresponding to the iron-containing compound is excluded). When the polishing liquid contains the oxidizing agent, the surface of the tungsten material is oxidized by the oxidizing agent, and thus the tungsten material can be polished at a superior polishing rate.

Examples of the oxidizing agent include hydrogen peroxide, nitric acid, potassium periodate, hypochlorous acid, peroxodisulfate, and ozone water. From the viewpoint of easily polishing the tungsten material at a superior polishing rate, the viewpoint that contamination due to an alkali metal, an alkali earth metal, a halide, or the like can be suppressed in a case where base substrate is a silicon substrate including an element for integrated circuits, and the viewpoint that a temporal change in composition is small, the oxidizing agent may include hydrogen peroxide. The content of the peroxodisulfate may be 0.01 mol or less, 0.003 mol or less, less than 0.003 mol, 0.001 mol or less, or substantially 0 mol, per 1 L of the polishing liquid.

The content of the hydrogen peroxide in the oxidizing agent may be more than 50% by mass, 60% by mass or more, 70% by mass or more, 80% by mass or more, 90% by mass or more, or 95% by mass or more, on the basis of the total mass of the oxidizing agent, from the viewpoint of easily polishing the tungsten material at a superior polishing rate. The oxidizing agent may be an embodiment composed of hydrogen peroxide (substantially 100% by mass of the oxidizing agent contained in the polishing liquid is hydrogen peroxide).

The content of the oxidizing agent may be in the following range on the basis of the total mass of the polishing liquid. The content of the oxidizing agent may be 0.01% by mass or more, 0.02% by mass or more, 0.05% by mass or more, 0.1% by mass or more, 0.5% by mass or more, 1.0% by mass or more, 2.0% by mass or more, 2.5% by mass or more, or 3.0% by mass or more, from the viewpoint of easily polishing the tungsten material at a superior polishing rate. The content of the oxidizing agent may be 50% by mass or less, 30% by mass or less, 15% by mass or less, 10% by mass or less, 8.0% by mass or less, 5.0% by mass or less, 4.0% by mass or less, 3.5% by mass or less, or 3.0% by mass or less, from the viewpoint of easily reducing roughening of the polished surface. From these viewpoints, the content of the oxidizing agent may be 0.01 to 50% by mass, 0.02 to 30% by mass, or 0.05 to 15% by mass.

A mass ratio R2 of the content of the oxidizing agent with respect to the content of the abrasive grains (the content of the oxidizing agent/the content of the abrasive grains) may be in the following range. The mass ratio R2 may be 0.01 or more, 0.05 or more, 0.1 or more, 0.5 or more, 1.0 or more, or 1.5 or more, from the viewpoint of easily polishing the tungsten material and the insulating material at a superior polishing rate. The mass ratio R2 may be 2.0 or more or 2.5 or more, from the viewpoint of adjusting the balance in polishing rate between the tungsten material and the insulating material. The mass ratio R2 may be 10 or less, 8.0 or less, 6.0 or less, 4.0 or less, 3.0 or less, or 2.5 or less, from the viewpoint of easily polishing the tungsten material and the insulating material at a superior polishing rate. The mass ratio R2 may be 2.0 or less or 1.5 or less, from the viewpoint of adjusting the balance in polishing rate between the tungsten material and the insulating material. From these viewpoints, the mass ratio R2 may be 0.01 to 10, 0.1 to 8.0, or 0.5 to 6.0.

A mass ratio R3 of the content of the oxidizing agent with respect to the content of the iron-containing compound (the content of the oxidizing agent/the content of the iron-containing compound) may be in the following range from the viewpoint of easily polishing the tungsten material at a superior polishing rate. The mass ratio R3 may be 10 or more, 50 or more, 100 or more, 150 or more, 200 or more, 250 or more, 300 or more, or 350 or more. The mass ratio R3 may be 2000 or less, 1500 or less, 1000 or less, 800 or less, 600 or less, 500 or less, or 400 or less. From these viewpoints, the mass ratio R3 may be 10 to 2000, 50 to 1000, or 100 to 500.

Organic Acid Component

The polishing liquid of the present embodiment may contain an organic acid component (provided that, a compound corresponding to the iron-containing compound or the oxidizing agent is excluded). The organic acid component may be at least one selected from the group consisting of an organic acid and a salt thereof. The organic acid means an organic compound having an acid group (such as a carboxy group or a sulfo group). Examples of the salt of the organic acid include alkali metal salts (for example, a sodium salt).

When the polishing liquid contains an organic acid component, the oxidizing agent is likely to be held in a stable state in the polishing liquid, and thus the tungsten material can be easily polished at a superior polishing rate and the pot life of the polishing liquid can be improved. The present inventors speculate the reasons why such an effect is obtainable as follows. However, the reasons are not limited to the contents to be as follows. That is, the organic acid component is dissociated in the polishing liquid, a cation (such as a proton or an alkali metal ion) is dissociated from at least one acid group to generate an anionic group (for example, a proton ($H^+$) is dissociated from a carboxy group (—COOH) to generate an anionic group (—COO$^-$)). Then, it is speculated that the dissociated organic acid component is chelated with the iron component (such as an iron ion) of the iron-containing compound, and thus decomposition of the oxidizing agent by the iron-containing compound can be suppressed, so that the oxidizing agent is stabilized.

Examples of the organic acid component include formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, adipic acid, glutaric acid, malic acid, citric acid, pimelic acid, maleic acid, phthalic acid, glycine, asparagine, alanine, glutamic acid, glutamine, valine, glutamine, leucine, isoleucine, lysine, serine, threonine, phenylalanine, tyrosine, methionine, tryptophan, ß-alanine, and salts thereof. The organic acid component may be used as a pH adjusting agent that adjusts the pH of the polishing liquid. The pH adjusting agent may be, for example, a compound that stabilizes the pH of the polishing liquid to 2.0 to 4.0. The pH adjusting agent may include an amino acid component (such as amino acid or a salt thereof), and may include an amino acid component having a first dissociation constant in a range of 2.0 to 4.0. As the organic acid component, an organic acid component different from an amino acid component may be used.

From the viewpoint of easily polishing the tungsten material at a superior polishing rate, the organic acid component may include at least one selected from the group consisting of carboxylic acid and carboxylate, may include at least one selected from the group consisting of malonic acid, succinic acid, adipic acid, glutaric acid, malic acid, citric acid, and salts thereof, and may include at least one selected from the group consisting of malonic acid and a salt thereof.

The number of carbon atoms of the organic acid component (the number of carbon atoms of a compound used as the organic acid component) may be in the following range from the viewpoint of easily polishing the tungsten material at a superior polishing rate. The number of carbon atoms of the organic acid component may be 1 or more, 2 or more, or 3 or more. The number of carbon atoms of the organic acid component may be 8 or less, 7 or less, 6 or less, 5 or less, 4 or less, or 3 or less. From these viewpoints, the number of carbon atoms of the organic acid component may be 1 to 8.

From the viewpoint of easily polishing the tungsten material at a superior polishing rate since the oxidizing agent is likely to be held in a further stable state, the organic acid component may include at least one selected from the group consisting of a divalent organic acid component, a trivalent organic acid component, and a tetravalent organic acid component. For example, the "divalent organic acid component" means an organic acid component in which the number of acid groups is 2. When the organic acid component has a plurality of acid groups, the dissociated organic acid component is likely to be chelated with the iron component of the iron-containing compound, and thus decomposition of the oxidizing agent by the iron-containing compound is likely to be suppressed.

From the viewpoint of easily polishing the tungsten material at a superior polishing rate since the oxidizing agent is likely to be held in a further stable state, the organic acid component may include an organic acid component not having a carbon-carbon unsaturated bond. It is speculated that, when the organic acid component does not have a carbon-carbon unsaturated bond having relatively high reactivity, the reaction between the organic acid component and the oxidizing agent is likely to be further suppressed, so that the oxidizing agent is likely to be held in a further stable state.

The organic acid component may include at least one organic acid component A selected from the group consisting of an organic acid having a dissociation rate of 1% or more at a pH of 2.7 and a salt thereof. In this case, the organic acid component A is dissociated and is likely to be chelated with the iron component of the iron-containing compound, and thus the oxidizing agent is likely to be stabilized. Thereby, the tungsten material is easily polished at a superior polishing rate, and the necessary amount of the organic acid component used can be reduced. From the same viewpoints, the dissociation rate of the organic acid component A may be 3% or more, 5% or more, 10% or more, or 15% or more. The organic acid component A is particularly suitable in a case where the pH of the polishing liquid is 2.0 to 4.0. The dissociation rate of the organic acid component A can be calculated based on the pH of the polishing liquid, the acid dissociation constant of the organic acid component, and the like. Examples of the organic acid component A include malonic acid, succinic acid, glutaric acid, adipic acid, malic acid, and citric acid.

From the viewpoint of easily polishing the tungsten material at a superior polishing rate, the organic acid component may include, as an organic acid component not having a carbon-carbon unsaturated bond, at least one selected from the group consisting of a divalent organic acid component and a trivalent organic acid component, and may include, as an organic acid component not having a carbon-carbon unsaturated bond and having a dissociation rate of 1% or more at a pH of 2.7, at least one selected from the group consisting of a divalent organic acid component and a trivalent organic acid component.

The content of the organic acid component, the content of the organic acid component A, or a content X that is the content of the organic acid component excluding the amino acid component may be in the following range on the basis of the total mass of the polishing liquid. The content X may be 0.001% by mass or more, 0.005% by mass or more, 0.01% by mass or more, 0.02% by mass or more, 0.03% by mass or more, 0.035% by mass or more, or 0.04% by mass or more, from the viewpoint of easily polishing the tungsten material at a superior polishing rate. The content X may be 10% by mass or less, 5% by mass or less, 1% by mass or less, 0.8% by mass or less, 0.5% by mass or less, 0.3% by mass or less, 0.1% by mass or less, 0.08% by mass or less, 0.05% by mass or less, or 0.04% by mass or less, from the viewpoint of easily reducing roughening of the polished surface. From these viewpoints, the content X may be 0.001 to 10% by mass, 0.005 to 5% by mass, or 0.01 to 1% by mass.

From the viewpoint that the organic acid component is likely to be chelated with iron ions so that the oxidizing agent is likely to be held in a stable state and the tungsten material is easily polished at a superior polishing rate, the number of molecules of the dissociated organic acid component with respect to one atom of the iron ion may be 1.5 or more, 2 or more, 4 or more, or 6 or more. The number of molecules of the dissociated organic acid component can be calculated from the dissociation rate of the organic acid component. For example, in a case where the pH of the polishing liquid is 2.7, the content of the iron ion (atomic weight: 55.85) is 0.001% by mass, and malonic acid (molecular weight: 104.06) is used as an organic acid component, since the dissociation rate of malonic acid at a pH of 2.7 is 52.8%, the content of the malonic acid (the total amount of dissociated malonic acid and non-dissociated malonic acid; the blending amount of malonic acid) may be 0.007% by mass (the number of molecules of the dissociated malonic acid with respect to one atom of the iron ion is 2) or more. The number of molecules of the dissociated malonic acid with respect to one atom of the iron ion is determined by calculating the substance quantity of the iron ion from the atomic weight and the content of the iron ion, and can be calculated from the substance quantity of the iron ion, the dissociation rate and the molecular weight of malonic, acid and the content of malonic acid with respect to one atom of the iron ion. The number of molecules of the dissociated organic acid component may be the number of molecules of an organic acid component different from the amino acid component.

Other Components

The polishing liquid of the present embodiment may contain a component not corresponding to the abrasive grains, the iron-containing compound, the oxidizing agent, the organic acid component, or water. As such a component, the polishing liquid of the present embodiment may contain an inorganic acid component (an inorganic acid and a salt thereof), an organic solvent, a water-soluble polymer (such as an anionic water-soluble polymer), a cationic surfactant, a cationic polymer having a structure unit derived from amino acid, a (meth)acrylic acid-based polymer, a polysaccharide, a quaternary phosphonium salt, an alkanolamine salt (such as alkyl sulfuric acid ester or alkyl ether sulfuric acid ester), a compound having a 1,2,3-triazolo[4,5-b]pyridine skeleton, cyclodextrin, tolyltriazole, diphenyl guanidine, a silicomolybdic acid compound, an aluminum component (such as an aluminum ion or an aluminum salt), and the like, and may not contain at least one of these components (the content thereof may be substantially 0% by mass on the basis of the total mass of the polishing liquid).

Examples of the inorganic acid component include phosphoric acid, sulfuric acid, and hydrochloric acid. The content of the inorganic acid component or the total amount of phosphoric acid, sulfuric acid, hydrochloric acid, and nitric acid (oxidizing agent) may be 0.1% by mass or less, 0.05% by mass or less, less than 0.05% by mass, 0.01% by mass or less, or substantially 0% by mass, on the basis of the total mass of the polishing liquid.

Examples of the organic solvent include methanol. The content of the organic solvent or the content of methanol may be 10% by mass or less, 7% by mass or less, less than 7% by mass, 1% by mass or less, 0.1% by mass or less, 0.01% by mass or less, 0.001% by mass or less, 0.0001% by mass or less, less than 0.0001% by mass, or substantially 0% by mass, on the basis of the total mass of the polishing liquid.

The content of the water-soluble polymer, the content of the anionic water-soluble polymer, the content of the cationic surfactant, the content of the cationic polymer having a structure unit derived from amino acid, the content of the (meth)acrylic acid-based polymer, the content of the polysaccharide, the content of the quaternary phosphonium salt, the content of the alkanolamine salt, the content of the compound having a 1,2,3-triazolo[4,5-b]pyridine skeleton, the content of the cyclodextrin, the content of the tolyltriazole, the content of the diphenyl guanidine, or the content of the silicomolybdic acid compound may be 0.1% by mass or less, less than 0.1% by mass, 0.01% by mass or less, less than 0.01% by mass, 0.005% by mass or less, less than 0.005% by mass, 0.001% by mass or less, less than 0.001% by mass, 0.0001% by mass or less, less than 0.0001% by mass, 0.00001% by mass or less, less than 0.00001% by mass, or substantially 0% by mass, on the basis of the total mass of the polishing liquid.

The polishing liquid of the present embodiment may not contain an aluminum component. The content of aluminum atoms may be 0.00001% by mass (100 ppb) or less, 0.000006% by mass (60 ppb) or less, less than 0.000006% by mass (60 ppb), 0.000005% by mass (50 ppb) or less, 0.0000035% by mass (35 ppb) or less, 0.000002% by mass (20 ppb) or less, 0.000001% by mass (10 ppb) or less, 0.0000005% by mass (5 ppb) or less, or substantially 0% by mass, on the basis of the total mass of the polishing liquid. The content of aluminum atoms can be measured, for example, by the following method.

Measurement Method: ICP-MS Method

Measurement apparatus: inductively coupled plasma mass spectrometer, manufactured by Agilent Technologies, Inc., trade name "Agilent 8800"

Pretreatment: The polishing liquid is mixed with an acid (such as hydrochloric acid, nitric acid, sulfuric acid, or hydrofluoric acid; 0.1 to 10% by volume based on the total amount of the polishing liquid) and then diluted with ultra-pure water (for example, diluted 2- to 100-fold).

Water

The polishing liquid of the present embodiment can contain water. Examples of water include pure water, ultra-pure water, and distilled water. The content of the water in the polishing liquid may correspond to the remainder of the polishing liquid excluding the contents of other components.

pH of Polishing Liquid

The pH of the polishing liquid of the present embodiment may be 2.0 or more, more than 2.0, 2.1 or more, 2.2 or more, 2.4 or more, 2.5 or more, more than 2.5, 2.6 or more, or 2.7 or more, from the viewpoint of easily polishing the tungsten material and the insulating material at a superior polishing rate and the viewpoint of easily suppressing corrosion of a polishing apparatus. The pH of the polishing liquid of the present embodiment may be 4.0 or less, less than 4.0, 3.7 or less, 3.5 or less, 3.3 or less, 3.0 or less, less than 3.0, 2.9 or less, 2.8 or less, or 2.7 or less, from the viewpoint of easily suppressing etching of the tungsten material. From these viewpoints, the pH of the polishing liquid may be 2.0 to 4.0, 2.1 to 3.7, 2.2 to 3.5, 2.5 to 3.5, or 2.5 to 3.0. The pH of the polishing liquid is defined as the pH at a liquid temperature of 25° C.

The pH of the polishing liquid of the present embodiment can be measured by a pH meter (for example, trade name: Model (F-51) manufactured by HORIBA, Ltd.). For example, after performing 3-point calibration of the pH meter using a phthalate pH standard solution (pH: 4.01), a neutral phosphate pH standard solution (pH: 6.86), and a borate pH standard solution (pH: 9.18) as calibration solutions, an electrode of the pH meter is placed in the polishing liquid, and the pH upon stabilization after an elapse of 2 minutes or longer is measured. At this time, the liquid temperatures of the calibration solutions and the polishing liquid are set to 25° C.

Storing Method

The polishing liquid of the present embodiment may be prepared as a stock solution for a polishing liquid from the viewpoint of suppressing costs incurred in preservation, transportation, storage, and the like. The stock solution for a polishing liquid is stored in such a state that the amount of water is more reduced than the amount to be predetermined during use, and can be used as the polishing liquid by being diluted with water before use or during use. The stock solution for a polishing liquid may be diluted with water immediately before polishing, and the stock solution for a polishing liquid and water may be supplied onto a polishing platen and diluted on the polishing platen.

The polishing liquid of the present embodiment may be stored as a one-pack polishing liquid containing at least abrasive grains, an iron-containing compound, and an oxidizing agent, and may be stored as a multi-pack polishing liquid having a slurry (first liquid) containing abrasive grains and an additive liquid (second liquid) containing an iron-containing compound and an oxidizing agent. In the multi-pack polishing liquid, the constituent components of the aforementioned polishing liquid are divided into the slurry and the additive liquid so that the slurry and the additive liquid are mixed to form the aforementioned polishing liquid. The additives (such as the iron-containing compound, the oxidizing agent, and the organic acid component) other than the abrasive grains may be contained in the additive liquid between the slurry and the additive liquid. The constituent components of the polishing liquid may be stored separately in three or more liquids. The polishing liquid may be prepared by mixing the slurry and the additive liquid in the multi-pack polishing liquid immediately before polishing or during polishing, and the polishing liquid may be prepared by supplying each of the slurry and the additive liquid in the multi-pack polishing liquid onto a polishing platen and mixing the slurry and the additive liquid on the polishing platen.

Polishing Method

A polishing method of the present embodiment includes a polishing step of polishing a surface to be polished containing a tungsten material by using the polishing liquid of the present embodiment. The polishing liquid used in the polishing step may be a one-pack polishing liquid, may be a polishing liquid obtained by diluting a stock solution for a polishing liquid with water, and may be a polishing liquid obtained by mixing a slurry and an additive liquid in a multi-pack polishing liquid.

The surface to be polished may contain an insulating material, a barrier material (for example, a barrier metal), and the like. Examples of the insulating material include silicon oxide and silicon nitride. Examples of the barrier material include tantalum, a tantalum alloy, a tantalum compound (such as tantalum oxide or tantalum nitride), titanium, a titanium alloy, and a titanium compound (such as titanium oxide or titanium nitride).

The polishing step may be a step of polishing a surface to be polished containing a tungsten material and at least one selected from the group consisting of an insulating material and a barrier material by using the polishing liquid of the present embodiment. The polishing step may be, for example, a step of polishing a base substrate having a tungsten member (a member containing a tungsten material) and at least one selected from the group consisting of an insulating member (a member containing an insulating material) and a barrier member (a member containing a barrier material).

The polishing step may include, in the stated order, as in the step of polishing the base substrate 10 of FIG. 1, a first polishing step of polishing the tungsten member 3 until the barrier member 2 is exposed (rough polishing step), a second polishing step of polishing the barrier member 2 and the tungsten member 3 until the insulating member 1 is exposed, and a third polishing step of polishing the insulating member 1, the barrier member 2, and the tungsten member 3 (finish polishing step). The polishing liquid of the present embodiment can be used in at least one of the first polishing step, the second polishing step, and the third polishing step. The first polishing step, the second polishing step, and the third polishing step may be continuously performed using the polishing liquid of the present embodiment, and some of the steps among the first polishing step, the second polishing step, and the third polishing step may be performed using the polishing liquid of the present embodiment and the remaining step may be performed using another polishing liquid.

An object to be polished having a surface to be polished may have a film shape (a film to be polished), and may include a tungsten film (a film containing a tungsten material). Examples of a method for forming a tungsten film include known sputtering and plating methods. In the polishing step, at least a part of a film to be polished (for example, a tungsten film) of a base substrate (for example, a substrate related to manufacturing of a semiconductor element) having a film to be polished can be polished using the polishing liquid of the present embodiment so as to be removed.

The polishing step may be, for example, a step of polishing a surface to be polished by pressing a surface to be polished of a base substrate against a polishing cloth (polishing pad) of a polishing platen, supplying the polishing liquid of the present embodiment to a space between the surface to be polished of the base substrate and the polishing cloth in a state where a predetermined pressure is applied to the base substrate from the surface of the base substrate (rear surface of the base substrate) opposite to the surface to be polished, and relatively moving the base substrate with respect to the polishing platen. The polishing cloth is not particularly limited, and a general nonwoven fabric, foamed polyurethane, a porous fluororesin, and the like can be used.

In the polishing method of the present embodiment, as a polishing apparatus, for example, a general polishing apparatus can be used which has a polishing platen to which a motor capable of changing the number of revolutions, or the like is attached and on which a polishing cloth can be mounted, and a holder capable of holding the base substrate. The polishing conditions are not particularly limited, but the rotation speed of the polishing platen may be adjusted to a low revolution of 200 min-1 (200 rpm) or less to prevent the base substrate from flying off from the polishing platen. The pressure for pressing the base substrate having the surface to be polished against the polishing cloth may be 1 to 100 kPa or 5 to 50 kPa, from the viewpoint of easily adjusting the uniformity of the polishing rate within the surface to be polished and pattern flatness to preferable ranges. During polishing, the polishing liquid may be continuously supplied to the polishing cloth with a pump or the like. The amount of the polishing liquid to be supplied is not limited, but the surface of the polishing cloth may be always covered with the polishing liquid.

In order to perform polishing (CMP or the like) with a consistent surface condition of the polishing cloth, the polishing method of the present embodiment may include a conditioning step of conditioning the polishing cloth before each polishing step. In the conditioning step, for example, the conditioning of the polishing cloth is performed with a liquid containing at least water, while using a dresser to which diamond particles attach.

The polishing method of the present embodiment may include a washing step of washing the base substrate after the polishing step. In the washing step, for example, the base substrate after the completion of polishing can be adequately washed in running water and then dried after removing droplets, which have attached onto the base substrate, with the use of a spin dry or the like. Furthermore, after performing a known washing method (for example, a method of removing the deposits on the base substrate by pressing a brush made from polyurethane against the base substrate with a constant pressure while letting a commercially available washing liquid flow on the surface of the base substrate and rotating the brush), the base substrate may be dried.

A method for producing a component of the present embodiment includes a component producing step of obtaining a component by using a base substrate (body to be polished) polished by the polishing method of the present embodiment. A component of the present embodiment is a component obtained by the method of producing a component of the present embodiment. The component of the present embodiment is not particularly limited, and may be an electronic component (for example, a semiconductor component such as a semiconductor package), may be a wafer (for example, a semiconductor wafer), and may be a chip (for example, a semiconductor chip). As an embodiment of the method for producing a component of the present embodiment, in a method for producing an electronic component of the present embodiment, an electronic component is obtained by using a base substrate polished by the polishing method of the present embodiment. As an embodiment of the method for producing a component of the present embodiment, in a method for producing a semiconductor component of the present embodiment, a semiconductor component (for example, a semiconductor package) is obtained by using a base substrate polished by the polishing method of the present embodiment. The method for producing a component of the present embodiment may include a polishing step of polishing a base substrate by the polishing method of the present embodiment before the component producing step.

The method for producing a component of the present embodiment may include, as an embodiment of the component producing step, an individually dividing step of dividing a base substrate (body to be polished) polished by the polishing method of the present embodiment into individual pieces. The individually dividing step may be, for example, a step of dicing a wafer (for example, a semiconductor wafer) polished by the polishing method of the present embodiment to obtain chips (for example, semiconductor chips). As an embodiment of the method for producing a component of the present embodiment, the method for producing an electronic component of the present embodiment may include a step of obtaining an electronic component (for example, a semiconductor component) by individually dividing a base substrate polished by the polishing method of the present embodiment into individual pieces. As an embodiment of the method for producing a component of the present embodiment, the method for producing a semiconductor component of the present embodiment may include a step of obtaining a semiconductor component (for example, a semiconductor package) by individually dividing a base substrate polished by the polishing method of the present embodiment into individual pieces.

The method for producing a component of the present embodiment may include, as an embodiment of the component producing step, a connecting step of connecting (for example, electrically connecting) a base substrate (body to be polished) polished by the polishing method of the present embodiment to another body to be connected. The body to be connected that is connected to the base substrate polished by the polishing method of the present embodiment is not particularly limited, and may be a base substrate polished by the polishing method of the present embodiment, and may be a body to be connected different from the base substrate polished by the polishing method of the present embodiment. In the connecting step, the base substrate and the body to be connected may be directly connected to each other (connected in a state where the base substrate and the body to be connected are in contact with each other), and the base substrate and the body to be connected may be connected via another member (such as a conductive member). The connecting step can be performed before the individually dividing step, after the individually dividing step, or before and after the individually dividing step.

The connecting step may be a step of connecting a polished surface of a base substrate polished by the polishing method of the present embodiment to a body to be connected, and may be a step of connecting a connection surface of a base substrate polished by the polishing method of the present embodiment to a connection surface of a body to be connected. The connection surface of the base substrate may be a polished surface that is polished by the polishing method of the present embodiment. A connection body including the base substrate and the body to be connected can be obtained by the connecting step. In the connecting step, in a case where the connection surface of the base substrate has a metal portion, the body to be connected may be connected to the metal portion. In the connecting step, in a case where the connection surface of the base substrate has a metal portion and the connection surface of the body to be connected has a metal portion, the metal portions may be connected to each other. The metal portion may contain a tungsten material.

A device of the present embodiment (for example, an electronic device such as a semiconductor device) includes at least one selected from the group consisting of the base substrate polished by the polishing method of the present embodiment and the component of the present embodiment.

EXAMPLES

Hereinafter, the present disclosure will be more specifically described by means of Examples; however, the present disclosure is not limited to these Examples.

Measurement of Average Particle Diameter and Silanol Group Density

The average particle diameter and the silanol group density of the silica particles (abrasive grains) were measured. The average particle diameter was measured using COULTER N4SD manufactured by COULTER Electronics under the conditions of a measurement temperature of 20° C., a solvent refractive index of 1.333 (water), a particle refractive index of unknown (set), a solvent viscosity of 1.005 cp (water), a run time of 200 seconds, a laser incidence angle of 90°, and an intensity in a range of 5E+04 to 4E+05. The silanol group density was measured and calculated according to the aforementioned procedures [1] to [8]. The results are shown in Table 1 and Table 2.

Preparation of Polishing Liquid

Deionized water, silica particles (abrasive grains, colloidal silica), iron nitrate nonahydrate (iron-containing compound, iron ion supplying agent), and malonic acid (organic acid component) were mixed, and then hydrogen peroxide (oxidizing agent) was mixed therewith, thereby preparing a polishing liquid containing silica particles, 0.008% by mass of iron nitrate nonahydrate, 0.04% by mass of malonic acid, and 3% by mass of hydrogen peroxide. The content of the silica particles was adjusted to the contents (unit: % by mass) shown in Table 1 and Table 2.

Measurement of Zeta Potential

The zeta potential (25° C.) of the silica particles (abrasive grains) in the polishing liquid of each Example was measured. The zeta potential at 25° C. of the silica particles in the polishing liquid was measured using DT1202 (trade name) manufactured by Nihon Rufuto Co., Ltd. The results are shown in Table 1.

Content of Aluminum Atoms

The content of aluminum atoms in the polishing liquid of each Example was measured. The content of aluminum atoms in all of Examples was 0.0000005% by mass (5 ppb) or less on the basis of the total mass of the polishing liquid.

pH Measurement

When the pH of each polishing liquid was measured as follows, the pH of the polishing liquid in all of Examples and Comparative Examples was 2.7.

Measuring instrument: pH meter (HORIBA, Ltd., trade name: Model (F-51))

Calibration solution: phthalate pH standard solution (pH: 4.01 (25° C.)), neutral phosphate pH standard solution (pH 6.86 (25° C.)), and borate pH standard solution (pH 9.18 (25° C.))

Measurement temperature: 25° C.

Measurement method: After performing 3-point calibration using calibration solutions, an electrode was placed in the polishing liquid and left to stand at 25° C. for 2 minutes or longer, and the pH upon stabilization was measured.

Evaluation

A tungsten film and a silicon oxide film of base substrates described below were polished under the following polishing conditions to obtain polishing rates for tungsten and silicon oxide. The polishing rate for tungsten was obtained by measuring electrical resistance values of the tungsten film before and after polishing by using a resistance measuring device VR-120/08S (manufactured by Hitachi Kokusai Electric Inc.) and then dividing a film thickness difference before and after polishing calculated from these electrical resistance values by a polishing time. The polishing rate for silicon oxide was obtained by measuring a film thickness difference in the silicon oxide film before and after polishing by using an optical-type film thickness meter F50 (manufactured by Filmetrics Japan, Inc.) and then dividing this film thickness difference by a polishing time. The results are shown in Table 1 and Table 2. As shown in Table 1, in Examples 1 to 6, it is found that the tungsten material can be polished at a superior polishing rate.

Base Substrate

Base substrate having a tungsten film: base substrate (diameter: 12 inches) having a tungsten film (thickness: 700 nm) formed on a silicon substrate Base substrate having a silicon oxide film: base substrate (diameter: 12 inches) having a TEOS (tetraethoxysilane) film (thickness: 1000 nm) formed on a silicon substrate

Polishing Conditions

Polishing machine for CMP: manufactured by Applied Materials, Inc., trade name "Reflexion L"

Polishing pad: IC1010 (manufactured by Nitta Haas Incorporated)
Polishing pressure: 20.7 kPa
Number of revolutions of platen: 90 rpm
Number of revolutions of head: 87 rpm
Amount of polishing liquid for CMP to be supplied: 300 mL/min
Polishing time of tungsten film and silicon oxide film: 0.5 minutes

TABLE 1

| | | Example | | | | | |
|---|---|---|---|---|---|---|---|
| | | 1 | 2 | 3 | 4 | 5 | 6 |
| Silica particles | Average particle diameter [nm] | 62 | 83 | 83 | 110 | 83 | 68 |
| | Silanol group density [groups/nm$^2$] | 1.6 | 1.8 | 1.8 | 3.2 | 4.8 | 6.0 |
| | Content [% by mass] | 2.0 | 2.0 | 1.2 | 2.0 | 2.0 | 2.0 |
| | Zeta potential [mV] | 10 | 13 | 11 | 3 | 0 | −1 |
| Polishing rate [nm/min] | Tungsten | 412 | 382 | 371 | 402 | 378 | 385 |
| | Silicon oxide | 177 | 237 | 155 | 92 | 86 | 113 |

TABLE 2

| | | Comparative Example | | | | |
|---|---|---|---|---|---|---|
| | | 1 | 2 | 3 | 4 | 5 |
| Silica particles | Average particle diameter [nm] | 201 | 218 | 121 | 37 | 27 |
| | Silanol group density [groups/nm$^2$] | 1.9 | 1.4 | 8.1 | 3.0 | 3.4 |
| | Content [% by mass] | 2.0 | 2.0 | 2.0 | 2.0 | 2.0 |
| Polishing rate [nm/min] | Tungsten | 254 | 253 | 344 | 193 | 216 |
| | Silicon oxide | 66 | 54 | 60 | 9 | 54 |

REFERENCE SIGNS LIST

1: insulating member, 2: barrier member, 3: tungsten member, 10: base substrate.

The invention claimed is:

1. A polishing liquid for polishing a surface to be polished containing a tungsten material, the polishing liquid comprising:
abrasive grains; an iron-containing compound; and an oxidizing agent, wherein
the abrasive grains include silica particles,
an average particle diameter of the abrasive grains is 40 to 140 nm,
a silanol group density of the silica particles is 5.5 to 8.0 groups/nm$^2$, and
a content of aluminum atoms is less than 0.000006% by mass on the basis of the total mass of the polishing liquid.

2. A polishing liquid for polishing a surface to be polished containing a tungsten material, the polishing liquid comprising:
abrasive grains; an iron-containing compound; and an oxidizing agent, wherein
the abrasive grains include silica particles,
an average particle diameter of the abrasive grains is 40 to 140 nm,
a silanol group density of the silica particles is 8.0 groups/nm$^2$ or less,
a zeta potential of the abrasive grains is 3.0 mV or less, and
a content of aluminum atoms is less than 0.000006% by mass on the basis of the total mass of the polishing liquid.

3. The polishing liquid according to claim 2, wherein the average particle diameter of the abrasive grains is 40 to 85 nm.

4. The polishing liquid according to claim 2, wherein the silanol group density of the silica particles is 2.5 groups/nm$^2$ or less.

5. The polishing liquid according to claim 2, wherein the silanol group density of the silica particles is less than 2.0 groups/nm$^2$.

6. The polishing liquid according to claim 2, wherein a zeta potential of the silica particles in the polishing liquid is more than −10 mV.

7. The polishing liquid according to claim 2, wherein the iron-containing compound includes at least one selected from the group consisting of iron nitrate and a hydrate thereof.

8. The polishing liquid according to claim 2, wherein a content of the iron-containing compound is 0.0001 to 0.1% by mass on the basis of the total mass of the polishing liquid.

9. The polishing liquid according to claim 2, wherein the oxidizing agent includes hydrogen peroxide.

10. The polishing liquid according to claim 2, further comprising an organic acid component.

11. The polishing liquid according to claim 10, wherein the organic acid component includes at least one selected from the group consisting of a divalent organic acid component and a trivalent organic acid component as an organic acid component not having a carbon-carbon unsaturated bond.

12. The polishing liquid according to claim 10, wherein the organic acid component includes at least one selected from the group consisting of malonic acid, succinic acid, adipic acid, glutaric acid, malic acid, citric acid, and salts thereof.

13. The polishing liquid according to claim 2, wherein a pH is 2.0 to 4.0.

14. The polishing liquid according to claim 2, wherein a pH is 2.5 to 3.5.

15. The polishing liquid according to claim 2, wherein the average particle diameter of the abrasive grains is 60 to 85 nm, and the silanol group density of the silica particles is 1.5 groups/nm$^2$ or more and less than 2.0 groups/nm$^2$.

16. The polishing liquid according to claim 2, wherein the content of the abrasive grains is 0.01% by mass or more and less than 3.0% by mass on the basis of the total mass of the polishing liquid.

17. A polishing method of polishing a surface to be polished containing a tungsten material by using the polishing liquid according to claim 2.

* * * * *